(12) United States Patent
Mukherjee et al.

(10) Patent No.: US 8,059,884 B2
(45) Date of Patent: Nov. 15, 2011

(54) METHOD AND SYSTEM FOR OBTAINING BOUNDS ON PROCESS PARAMETERS FOR OPC-VERIFICATION

(75) Inventors: Maharaj Mukherjee, Wappingers Falls, NY (US); Ioana Graur, Poughkeepsie, NY (US); Alan E. Rosenbluth, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 1014 days.

(21) Appl. No.: 11/937,073

(22) Filed: Nov. 8, 2007

(65) Prior Publication Data
US 2009/0123057 A1 May 14, 2009

(51) Int. Cl.
*G06K 9/20* (2006.01)
(52) U.S. Cl. ....................................................... 382/144
(58) Field of Classification Search .................. 382/144; 438/7–9, 16; 700/110, 121; 356/237.6
See application file for complete search history.

(56) References Cited

U.S. PATENT DOCUMENTS

| | | |
|---|---|---|
| 5,208,124 A | 5/1993 | Sporon-Fiedler et al. |
| 6,602,728 B1 | 8/2003 | Liebmann et al. |
| 6,649,309 B2 | 11/2003 | Mukherjee |
| 6,709,793 B1 | 3/2004 | Brankner et al. |
| 6,928,636 B2 | 8/2005 | Ohnuma |
| 6,934,929 B2 | 8/2005 | Brist et al. |
| 6,967,710 B2 | 11/2005 | Shiraishi |
| 7,065,738 B1 | 6/2006 | Kim |
| 7,127,699 B2 | 10/2006 | Gallatin et al. |
| 7,266,800 B2 | 9/2007 | Sezginer |
| 2005/0210437 A1* | 9/2005 | Shi et al. ................ 382/144 |
| 2007/0061772 A1 | 3/2007 | Ye et al. |

OTHER PUBLICATIONS

International Search Report and Written Opinion—Intern'l filing date—April 23, 2008 PCT/US2008/061196.

* cited by examiner

*Primary Examiner* — Kara E Geisel
(74) *Attorney, Agent, or Firm* — Yuanmin Cai (57) ABSTRACT

Embodiments of the present invention provide a method of performing printability verification of a mask layout. The method includes creating one or more tight clusters; computing a set of process parameters associated with a point on said mask; comparing said set of process parameters to said one or more tight clusters; and reporting an error when at least one of said process parameters is away from said one or more tight clusters.

21 Claims, 11 Drawing Sheets

METHOD AND SYSTEM FOR OBTAINING BOUNDS ON PROCESS PARAMETERS FOR OPC-VERIFICATION

FIELD OF THE INVENTION

The present invention relates generally to the field of optical lithography, and more particularly, to method and system for obtaining bounds on process parameters for verifying results obtained by Resolution Enhancement Techniques (RET) such as an Optical Proximity Correction (OPC) technique.

BACKGROUND OF THE INVENTION

Optical microlithography process, also known as photolithography process, has been widely used in semiconductor device manufacturing. The process includes duplicating or transferring circuit patterns from a template, commonly known as a photo-mask, onto semiconductor wafers. The circuit patterns on the photo-mask are typically represented by opaque, transparent, and/or semi-transparent regions. Patterns on the photo-mask template are then projected onto a photo-resistant coated wafer by ways of optical imaging through an exposure system.

Continuous advancement of Very Large Scale Integrated (VLSI) chip manufacturing technology to meet Moore's law of shrinking device dimensions in geometric progression has spurred the development of various Resolution Enhancement Techniques (RET) such as, for example, Optical Proximity Correction (OPC) methodology in optical microlithography. OPC is the method of choice for chip manufacturers in the foreseeable future due to its high volume yield in manufacturing and past history of success. Nevertheless, the ever shrinking device dimensions, combined with desires to enhance circuit performance in the deep sub-wavelength domain, require complex methodologies to ensure fidelity of mask patterns being transferred onto a printed wafer.

The ever increasing cost of mask manufacturing and inspection and the ever increasing complexity of OPC require that accuracy of a mask is correctly and properly verified before being manufactured. This is generally known as mask Manufacturability Verification (MV) or Printability Verification (PV). The primary focus of mask printability verification is to ensure accurate simulation, which means that the simulation shall not miss any real error on the mask. The cost of finding an error, when a mask is actually manufactured and particularly when it is being used in chip manufacturing, is known to be extremely high, which underlines the criticality of accuracy in the printability verification simulation process.

The accuracy of printability verification simulation generally depends on the accuracy and predictability of the underlying computer simulation model that represents the optical lithography process. The model for optical lithographic process is usually calibrated based on empirical data obtained from measurements of a set of test structures which are exposed under a single set of nominal exposure(s) or multiple set of exposures of variations of the nominal exposure conditions. The lithographic process model may generally include at least an optical model and a resist model, designed to capture various physical and/or chemical effects associated with the lithographic process.

An optical model typically represents the optical part of the lithographic process and may include effects from, for example, optical source, lithographic mask, and other optical elements such as a collection of lenses. Optical models used in printability verification are typically the same models as those used in OPC such as a Model-Based OPC (MBOPC). These models are in general related to a Sum of Coherent Source (SOCS) method, which is an algorithm for efficient computation of bilinear transform of Hopkins integral, to be described below in more details.

A resist model is usually created by statistically fitting mathematical equations to the empirical data. The resist parameters used in the model are often dependent on image traits such as minimum image intensity (Imin); maximum image intensity (Imax); slope of the image intensity (Islope); curvature of the image intensity (Icurve); etc. There are other properties such as image and pattern density which are also used in calibrating the image parameters.

Since the resist model and ultimately the lithographic process model are based upon the empirical data, their accuracy for predicting an image at a particular point depends on the proximity of that particular point, and parameters associated therewith, to the data used in the calibration or fitting. The accuracy of predication generally increases when the point under evaluation is near and within bounds of the fitted data. The accuracy of predication diminishes when the point under evaluation is farther and farther away from the fitted data.

In the state of art, printability verification is done without checking the accuracy of the predictability of the simulating model. In other words, same simulation accuracy is generally assumed over the whole mask layout irrespective of whether process parameters, which may be referred to as image parameters hereinafter, generated during verification are within the bounds of their predictability. The process of printability verification tries to determine the existence of errors in printability, identify such errors, and ensure that errors are not missed as a result of less accurate simulations.

Since calibration of the lithographic process model is generally based upon standard test structures that cannot exclusively represent all the complex scenarios appearing on real mask layouts, predictability of certain results may be extended from existing calibration data by applying interpolation and/or extrapolation. Generally, evaluation of an image tends to become less predictable in places where the results are extrapolated. Printability Verifications need to be aware of where results are less predictable.

In view of the above, there is a need in the art for improving the existing models and processes of performing mask printability verification such that no costly errors are missed.

SUMMARY OF EMBODIMENTS OF THE INVENTION

Embodiments of the present invention provide a method of performing printability verification of a mask layout. The method includes creating one or more tight clusters; computing a set of process parameters associated with a point on the mask; comparing the set of process parameters to the one or more tight clusters; and reporting an error when at least one of the process parameters is away from the one or more tight clusters, wherein the one or more tight clusters is a cluster selected from a group consisting of convex hull and ellipsoid.

According to one embodiment, creating the one or more tight clusters may include measuring a group of calibration data from a plurality of test structures; creating a process model in a space having one or more dimensions; applying the process model to the group of calibration data thus obtaining a group of process parameters; and dividing the group of process parameters into the one or more tight clusters in the space of one or more dimensions.

According to another embodiment, dividing the group of process parameters may include applying a grid based unsupervised clustering approach thus approximating a number of clusters from the group of process parameters; and applying a supervised clustering approach thus smoothing the number of clusters.

According to yet another embodiment, smoothing the number of clusters may include applying convex hulls or ellipsoids to corresponding process parameters in the number of clusters.

According to one embodiment, computing a set of process parameters may include identifying the point on the mask; applying the process model to the point thus obtaining an output point corresponding to the point on the mask; and deriving the set of process parameters from the output point.

According to another embodiment, comparing the set of process parameters include providing one or more pre-determined values relating to a level of predictability establishing one or more inequalities for the one or more tight clusters using the one or more pre-determined values; applying the one or more inequalities in testing the set of process parameters; and determining whether one or more of the process parameters are away from the one or more tight clusters from the testing.

According to one embodiment, data in the group of calibration data are about 7 to about 20 times more than the dimensions of the space; reporting an error includes reporting the error when the at least one of the process parameters is away from the one or more tight clusters by a pre-determined value.

BRIEF DESCRIPTION OF THE DRAWINGS

The present invention will be understood and appreciated more fully from the following detailed description of the invention, taken in conjunction with the accompanying drawings of which.

It will be appreciated that for the purpose of simplicity and clarity of illustration, elements in the drawings have not necessarily been drawn to scale. For example, dimensions of some of the elements may be exaggerated relative to other elements for clarity purpose.

DETAILED DESCRIPTION OF EMBODIMENTS

In the following detailed description, numerous specific details are set forth in order to provide a thorough understanding of embodiments of the invention. However, it will be understood by those of ordinary skill in the art that embodiments of the invention may be practiced without these specific details. In the interest of not obscuring presentation of essences and/or embodiments of the present invention, in the following detailed description, processing steps and/or operations that are well known in the art may have been combined together for presentation and/or for illustration purpose and in some instances may not have been described in detail. In other instances, processing steps and/or operations that are well known in the art may not be described at all. A person skilled in the art will appreciate that the following descriptions have rather focused on distinctive features and/or elements of embodiments of the present invention.

Figure 1A:
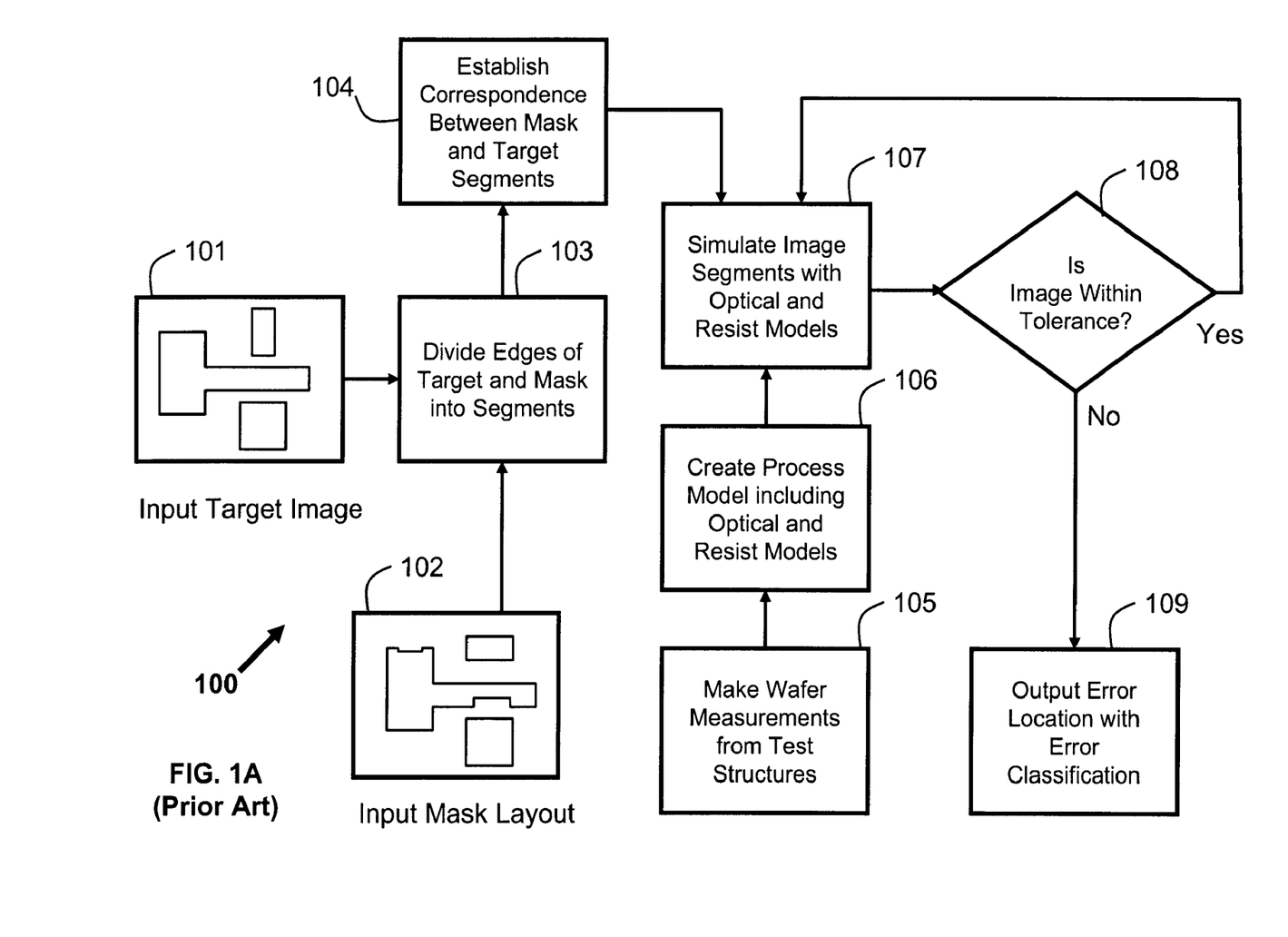
FIG. 1A is a simplified flowchart illustration of a method of performing printability verification, as is known in the art.

FIG. 1A is a simplified flowchart illustration of a method of performing printability verification, as is known in the art. Method 100 may include steps of providing a target wafer image 101 and one or more simulated mask layout 102 as inputs. Typically, simulated mask layout 102 is obtained by applying certain Resolution Enhancement Technique (RET) such as an Optical Proximity Correction (OPC) technique, for example, to an initial mask layout being created in connection with target wafer image 101. Method 100 may then divide, at step 103, edges of both target wafer image 101 and simulated mask layout 102 into one or more segments, and may establish correspondence or relationship between segments of target wafer image 101 and segments of simulated mask layout 102 at step 104. Such correspondence or relationship may be established through, for example, one or more points along the segments.

Separately, method 100 may expose a set of relatively simple and/or standard mask layouts to a test wafer to create a set of corresponding test structures. Method 100 may then observe and make measurements, at step 105, of these test structures. At step 106, method 100 may create, build, or establish, based on these measurements, a calibrated lithographic process model, which may include an optical model, a resist model, and other process effects. Lithographic Process Simulation using the process model is described below in detail with reference to FIG. 2.

After establishing the empirically calibrated lithographic process model, method 100 may proceed, at step 107, to simulate or recreate wafer image segments corresponding to each mask layout segments. The simulated wafer image segments are then compared against those corresponding segments of target wafer image 101 at step 108. If one or more of the simulated wafer image segments do not match that of the corresponding target wafer image 101, within a predetermined tolerance range, method 100 may report, at step 109, that an error has occurred in the OPC simulation.

Figure 1B:
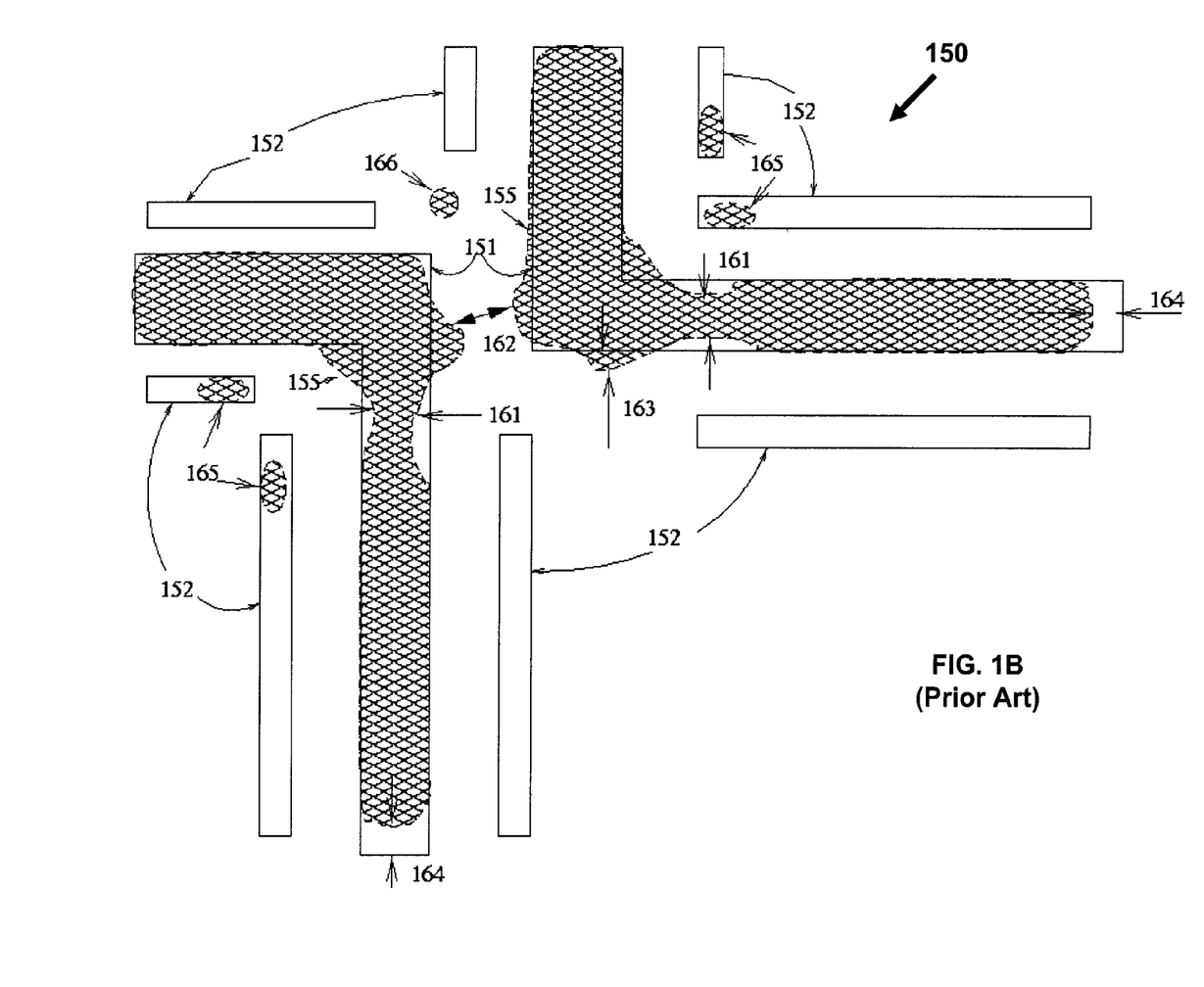
FIG. 1B is a demonstrative illustration of a mask layout with its corresponding simulated wafer image.

FIG. 1B is a demonstrative illustration of a mask layout and a corresponding simulated wafer image. Mask layout 150 may include primary mask layouts 151 and sub-resolution assist features (SRAFs) 152 (also known as Scattering Bars). As is known in the art, SRAFs 152 do not print themselves, but are placed on mask layout 150 to assist the printing of shapes of primary mask layouts 151. During chip manufacturing, instead of primary mask layouts 151, which are in substantially the same shapes as target image, simulated wafer image 155, which is in general different from primary mask layouts 151, may get printed on the wafer.

As is known in the art, proper functioning of a semiconductor wafer or chip requires printed wafer images meeting or exceeding tight tolerance when being compared with their target wafer images. However, deviation of a simulated wafer image from its target image is inevitable, which may cause errors and sometimes the errors may become critical when they exceeding a pre-determined tolerance level. In general, errors resulting from OPC simulation may include: for example, a "necking or pinching error" 161 which refers to situations where a width of the wafer image is smaller than a pre-determined minimum width value;

a "bridging error" 162 which refers to situations where the spacing between two wafer images is smaller than a pre-determined minimum spacing value;

an "edge placement error (EPE)" 163 which refers to situations where the wafer image edge is displaced from the target edge of primary mask layout 151 by a distance larger than a predetermined maximum displacement tolerance value;

a "line end shortening error" 164 which refers to situations where the wafer image edge at a line-end is displaced from the target line-end edge of primary mask layout 151 by a distance larger than a predetermined displacement tolerance value;

a "SRAF printing error" 165 which refers to situations where a part of the SRAF gets printed even though the SRAF is not supposed to be printed; and any additional printing errors which may occur, for example, due to diffraction effects such as "side-lobe printing artifact" 166.

Errors of those listed above may be categorized into two different types. As is known in the art, errors in a first category or type may be known as Catastrophic Errors. Normally, a circuit or device may fail to malfunction or not function at all if any of these Catastrophic Errors occurs. A second category of errors may be known as Performance Errors. Error of this category or type does not make a circuit or device malfunction. But performance of the circuit or device in terms of its speed or power consumption may degrade, particularly with the increasing number of such errors.

Examples of Catastrophic Errors may include necking or pinching error 161, bridging error 162, SRAF printing error 165, and other printing errors such as side-lobe printing artifact 166. In addition, line end shortening error 164 may also be categorized as Catastrophic Errors if it happens to miss any connections with a next layer in the chip due to overlay errors. Catastrophic Errors are generally presentable in an enumerable manner, wherein a mask layout, such as mask layout 150, must correct all of them before the related circuit or device may be manufactured.

On the other hand, edge placement error 163 may be considered as an example of Performance Errors. Performance Errors are generally considered as statistical in nature, and a small level of Performance Errors across the mask layout may be considered as tolerable.

Figure 2:
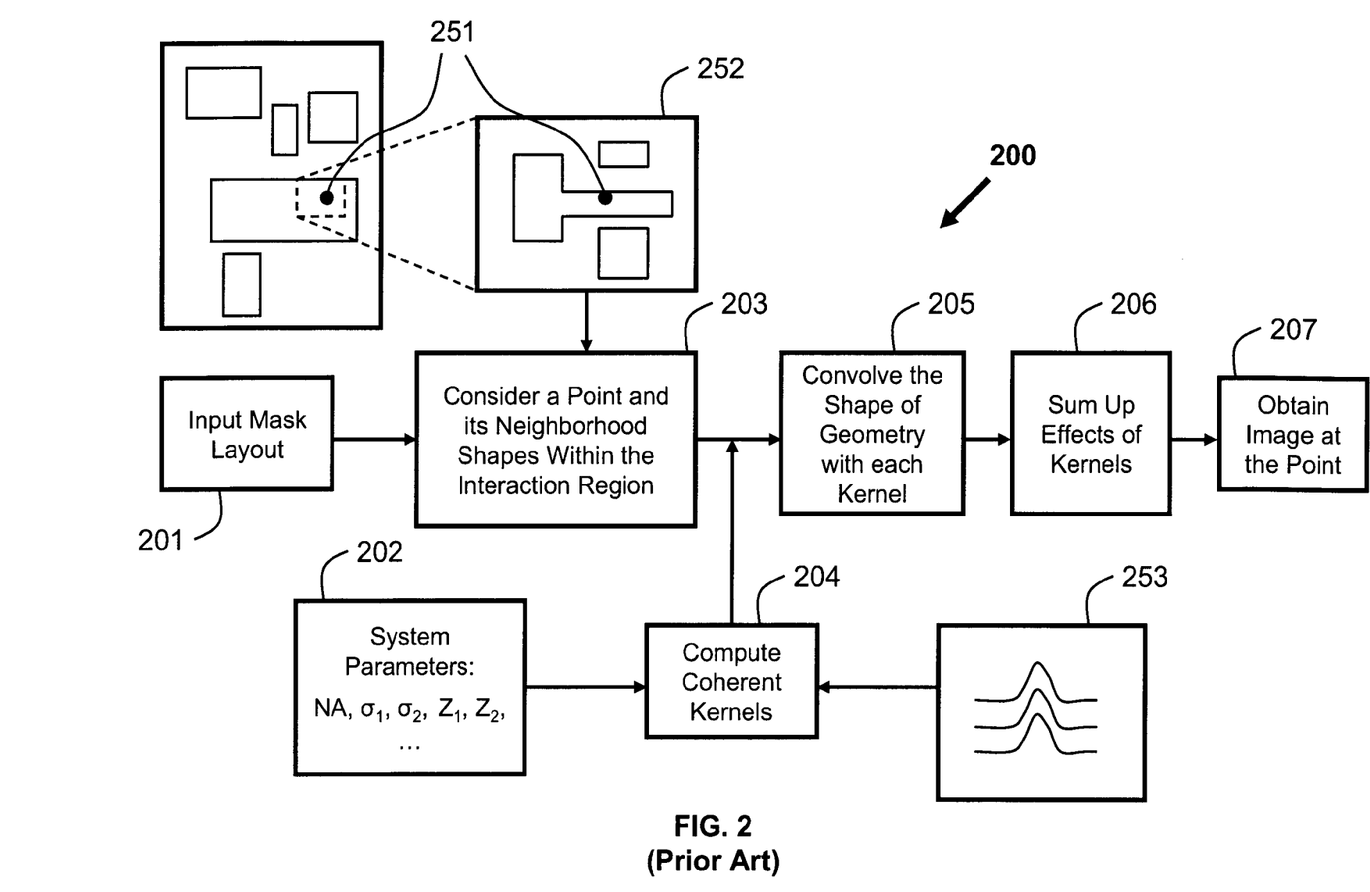
FIG. 2 is a simplified flowchart illustration of a method of recreating an output wafer image, as is known in the art.

FIG. 2 is a simplified flowchart illustration of a method of simulating or recreating an output wafer image as is known in the art, such as the method used in printability verification at step 107 in FIG. 1A. Specifically, FIG. 2 illustrates an optical model used in simulating or recreating image intensity at a given point on a mask layout due to optical effects. Although other models may be used, the optical model used in model-based OPC (MBOPC) is typically used in printability verification. MBOPC related models are in general related to a Sum of Coherent Source (SOCS) method, which is an algorithm for efficient calculation of bilinear transform of Hopkins integral.

As is known in the art, method 200 provides a mask layout 201 and a set of optical system parameters 202 as inputs. Parameters 202 may include for example wavelength λ of the light used, source parameters such as inner and outer radius $\sigma_1$ and $\sigma_2$ of the source pupil, numerical aperture NA, and Zernike parameters $Z_1, Z_2, \ldots, Z_n$ that define the lens aberrations of the optical system used in creating mask layout 201.

In order to simulate optical image intensity at a point 251, method 200 considers at step 203 an optical interaction region 252 surrounding the simulation point 251. Interaction region 252 may typically be a square area having dimensions of typically a few microns that encloses all shapes that will have a significant optical influence on the image intensity at the simulation point 251. As is known in the art, the size of the interaction region 252 is normally determined by the tradeoff between computational-speed versus desired accuracy.

Method 200 applies SOCS method in computing, at step 204, coherent kernels 253 of the Hopkins model. The coherent kernels 253 are then convolved with shapes of various mask layouts within interaction region 252 at step 205. The results are summed up at step 206 to approximate image intensity at the simulation point 251 at step 207.

As is known in the art, by applying the Hopkins model of integral for scalar partial coherent image formation, an aerial image intensity may be expressed by below equation (1)

$$I_0(\vec{r}) = \iiiint d\vec{r}' d\vec{r}'' h(\vec{r}-\vec{r}')h^*(\vec{r}-\vec{r}'')j(\vec{r}'-\vec{r}'')m(\vec{r}')m^*(\vec{r}'') \tag{1}$$

where, h is a lens impulse response function (also known as point spread function or PSF); j is the coherence of light; m is a mask transmission function; * denotes a complex conjugate; and $\vec{r}$ denotes the position of image under simulation. The integration of equation (1) is typically performed over the mask.

Inside equation (1), the following expression, or equation (2), $$h(\vec{r}-\vec{r}')h^*(\vec{r}-\vec{r}'')j(\vec{r}'-\vec{r}'') \tag{2}$$

may be known as the Hopkins kernel, which is a fixed two-dimensional (2D) function for a given optical system.

The 4-dimensional (4D) Hopkins integral of equation (1) may be approximated as an incoherent sum of multiple 2-dimensional (2D) coherent image integrals, which is known as the Sum of Coherent Systems (SOCS) method or procedure. In a SOCS procedure, an optimal n-term approximation to a partially coherent Hopkins integral may be expressed by following equation (3)

$$I_0(\vec{r}) \cong \sum_{k=1}^{n} \lambda_k |(m \otimes \phi_k)(\vec{r})|^2 = \sum_{k=1}^{n} Q_k(\vec{r}) \tag{3}$$

where $Q_k(\vec{r}) = |(m \otimes \kappa_k)(\vec{r})|^2$; $\otimes$ denotes a 2-dimensional (2D) convolution operation; and $\kappa_k = \phi_k(\vec{r})\sqrt{\lambda_k}$ is the Hopkins kernel, and where $\lambda_k$, $\phi_k(\vec{r})$ represent $k^{th}$ eigen-value and eigen-function, respectively, of the Hopkins kernel, derived from following equation (4) of a Mercer expansion $$h(\vec{r}')h^*(\vec{r}'')j(\vec{r}'-\vec{r}'') = \sum_{k=1}^{\infty} \lambda_k \phi_k(\vec{r}')\phi_k(\vec{r}'') \quad (4)$$

The above Mercer expansion shows that a partially coherent image may be optimally approximated by a finite sum of coherent images obtained, for example, by linear convolution.

In computing the image intensity, the source and mask layout polygons are typically decomposed (e.g. into grids or sectors), and each field image is computed as an incoherent sum of coherent sub-images (also referred to as component-images, or pre-images). The total intensity at an image point is calculated as the summation over all component images.

Based on the SOCS method, the number of coherent sub-images may be minimized by, e.g., diagonalizing the image matrix to achieve an acceptable approximate matrix of minimal rank through eigen-value decomposition. For example, a large-fill source may be adequately approximated when the number of 2D convolutions is a range from about 10 to about 20. Asymmetrical artifacts may occur that are related to multiplicity of eigen-values, but such asymmetry effects are typically too small to cause catastrophic errors, and may be ignored.

Performing printability verification may also involve modeling effects from other non-optical lithographic processes such as response of the resist to optical image intensity. As is known in the art, Constant Threshold Resist (CTR) models assume that there is a fixed intensity level, i.e., a constant threshold, at which a resist will interact with a light and form or cause development of a printed image. However, commonly used resist may respond in a non-linear fashion to the intensity, influenced by factors such as slope, curvature, and maximum and minimum intensity in the region around the point of interest, which in turn may be influenced by factors such as the spacing and size of features in the patterns to be printed.

In order to predict resist response to optical intensity, variable threshold models may be preferably used. Variable threshold models are constructed to predict an effective intensity threshold at which images will print or develop in response to the radiation transmitted by an optical system through mask. As is known in the art, the variable threshold models may be expressed as functions of image traits and, may be calibrated based on empirical data using test patterns that represent typical circuit patterns. Intersections of model-generated variable thresholds with simulated image intensity may provide contour curves, which predict the shapes that will be printed on a wafer. Equally, the models may be used to predict possible offset of simulated image shapes relative to target image shapes to be printed on the wafer.

As is known in the art, predictability of lithographic models depends on the quality of parameters used in the image evaluation. A model may be considered most predictable if the parameter values used in the model are close to those used in the test measurements which are generally used in calibrating the model. Otherwise, parameters need to be interpolated or extrapolated for the point under evaluation. Generally, the further away the values of process parameters from those used in the model calibration, the less predictable the model is.

Figure 3:
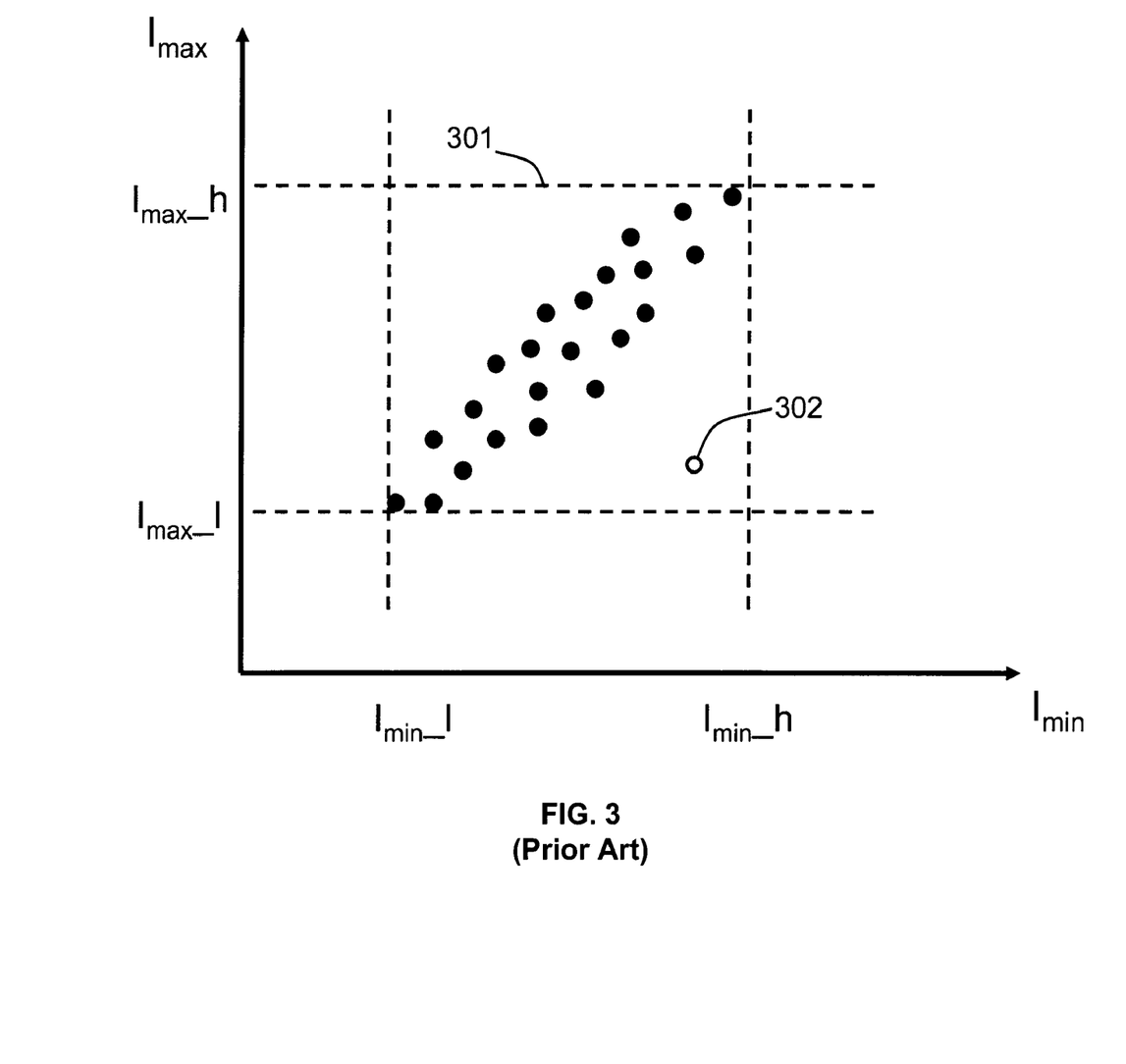
FIG. 3 is a demonstrative illustration of a cluster of calibration data and a test data.

Attempts were made to address predictability of existing models by setting minimum and maximum bounds on model calibration parameters, which are also referred to hereinafter as process parameters or image parameters. FIG. 3 is a demonstrative illustration of a cluster of wafer calibration data points (solid dots) used in model calibration and an exemplary test data point (empty dot). Conventionally, the bounds are based on dividing calibration data into multi dimensional arrays. FIG. 3 illustrates that even though test point 302 (empty dot) is within bounding box or square 301 of the minimum and maximum values of process or image parameters (solid dots), it is clearly not close enough to these process parameters for reliable prediction.

Predictability of current lithographic models may be improved by employing certain embodiments of the present invention, as being described below in more details.

Figure 4:
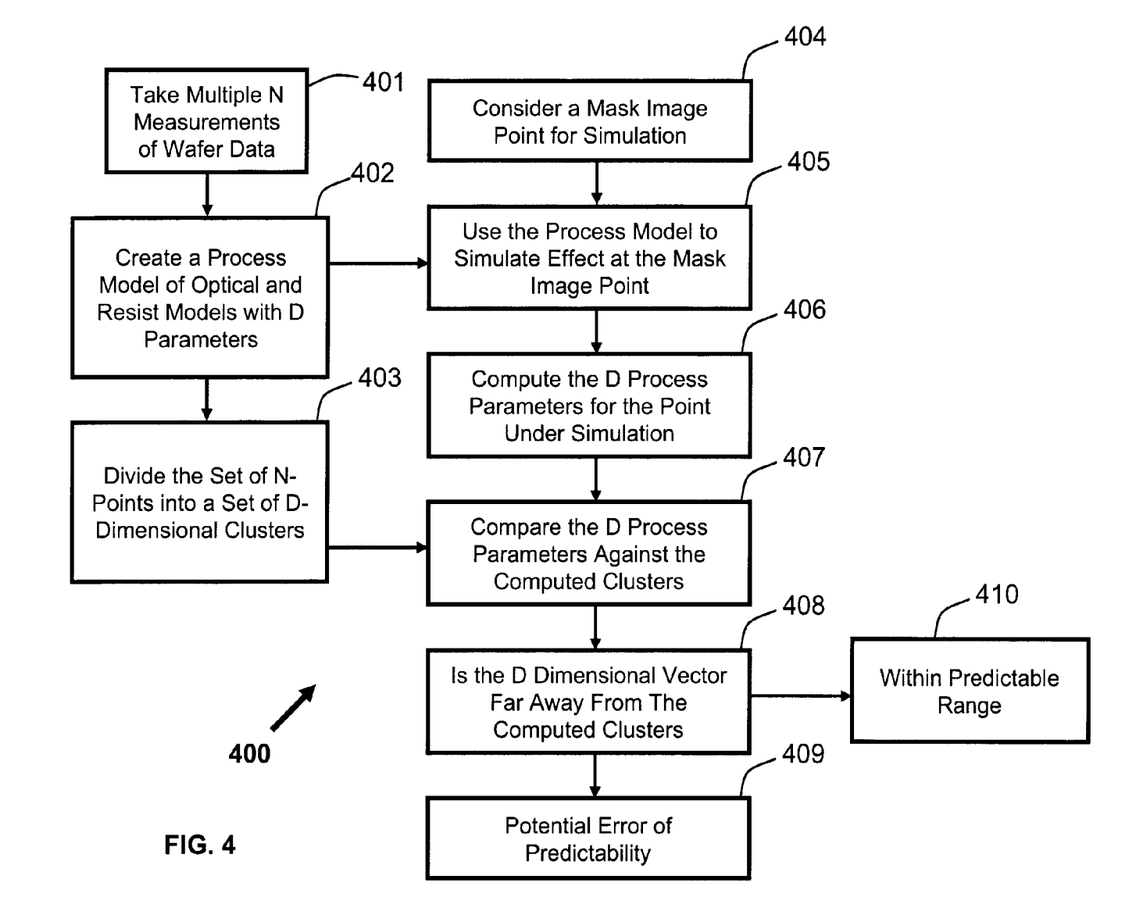
FIG. 4 is a demonstrative flowchart illustration of a method of performing printability verification according to embodiments of the present invention.

FIG. 4 is a simplified flowchart illustration of a method of performing printability verification according to certain embodiments of the present invention. In accordance with one embodiment, improvement may be made on the calibration of lithographic process model used in the OPC process. For example, as illustrated in FIG. 4, method 400 may include first taking multiple (N) measurements, at step 401, from multiple test structures on a wafer or on several wafers with N being a number varying typically from a few hundred to a few thousand. The multiple test structures may be created by exposing a wafer or wafers to light under various relatively simple mask layouts. Method 400 may then create, build, or establish a lithographic process model at step 402. The lithographic process model may include at least an optical model, at least a resist model, and may take into account other process effects. The constructed lithographic process model may include terms of a conventional lithographic process model, as well as other terms that may be formed from a SOCS model.

For example, a lithographic process model may include a polynomial function having a series of terms. The number of terms in the lithographic process model shall be sufficiently large to simulate non-linear behavior of the lithographic process, but need not to be more than necessary to provide a smooth fit to the wafer calibration data. For example, one criterion that may be used is that the number of empirical data points should exceed the number of terms by at least a factor of ten and in some instances a factor in the hundreds. Coefficients for the terms in the lithographic process model may be determined by fitting predicted model intensity threshold values to intensity threshold values obtained from empirical data, such as SEM measurements of line widths obtained from test patterns printed under nominal process conditions. The fitted lithographic process model may then be used to simulate the behavior of the image transfer that includes other non-optical process effects.

Method 400 may also include terms derived from certain image traits representing a simulated optical image, such as slope, curvature, Imax, and Imin, as in a conventional process model. Here, Imax and Imin denote the maximum and minimum intensity values within a distance around the point under evaluation. More specifically, Imax typically varies in a range from about 0.2 to about 0.3 and Imin typically varies between 0 and about 0.15. The slope of intensity at the point under evaluation is first derivative of the intensity with respect to distance along a perpendicular to the feature edge being imaged. The curvature is the second derivative of the intensity with respect to distance along a line parallel to the feature edge at the point under evaluation.

In accordance with some embodiments, the lithographic process model also includes terms formed from cross-products of the image traits with terms for the SOCS contributions made by successive kernels, e.g., to the intensity at the center or reference edge of the feature to be printed. In other words, the function, e.g. polynomial, representing the process model may typically include individual image trait terms and SOCS terms. A person skilled in the art will appreciate that, if the polynomial used in the lithographic process model contains only terms from a conventional OPC resist models, then the lithographic process model will have the same or substantially the same accuracy as the conventional OPC resist model in final predictions, or in the final-stage predictions after all SOCS kernels have been calculated.

An example of a polynomial function that may be used to construct a process model in accordance with the invention is provided below. In this example, the model is constructed using conventional modeling traits, such as density kernels, slope, curvature, Imax, and Imin, together with SOCS kernel values, and including a constant term, linear terms, quadratic terms, and a few key interaction (i.e. product) terms. Further for example, using six (6) density kernels, the polynomial used to construct a process model of the variable intensity threshold after four (4) SOCS kernels being calculated may be expressed as:

$$c0+c1*slope+c2*Imax+c3*Imin+c4*curvature+ \\ c5*D1+c6*D2+c7*D3+c8*D4+c9*D5+c10*D6+ \\ c11*slope2+c12*Imax2+c13*Imin2+ \\ c14*curvature2+c15*D12+c16*D22+c17*D32+ \\ c18*D42+c19*D52+c20*D62+c21*slope*Imax+ \\ c22*slope*Imin+c23*Imax*Imin+c24*+c25*+ \\ c26slope+c27Imax+c28**Imin+c29*+ \\ c30*+c31slope+c32Imax+c33**Imin+ \\ c34*+c35*+c36slope+c37Imax+ \\ c38*+Imin+c39+c40+c41**$$

In the above equation, the term c0 is typically determined during calibration to be the intensity value that predicts the printed edge position relatively accurate when applied to all critical images, and is equivalent to the optimum constant threshold used in a Constant Threshold Resist (CTR) model.

In general, wafer calibration data are obtained from test structures created under certain nominal lithographic process, or small variations, thereof. In other words, a proper reference dose of exposure is typically selected such that the minimum space and lines will print at the desired size, which may be determined experimentally. The inverse of the reference dose is sometimes referred to as the reference threshold.

The lithographic process model may then be calibrated by applying the N measurement data points obtained at step 401. To calibrate the lithographic process model, according to one embodiment, method 400 may divide the N measurement data points into a set of tight clusters in a D-dimensional space, at step 403, such that the process model may be described by parameters in the D-dimensional space. A tight cluster, as defined hereinafter, may refer to a cluster of data points wherein the bound of the cluster is defined by straight or smooth lines (in a two-dimensional space) or flat or smooth surfaces (in a three or more dimensional space) interconnecting and enclosing the data points. For example, the tight clusters may be a group of convex hulls or ellipsoids in the D-dimensional space. A convex hull is generally defined as the smallest convex polyhedron containing a certain number of points.

Figure 5A:
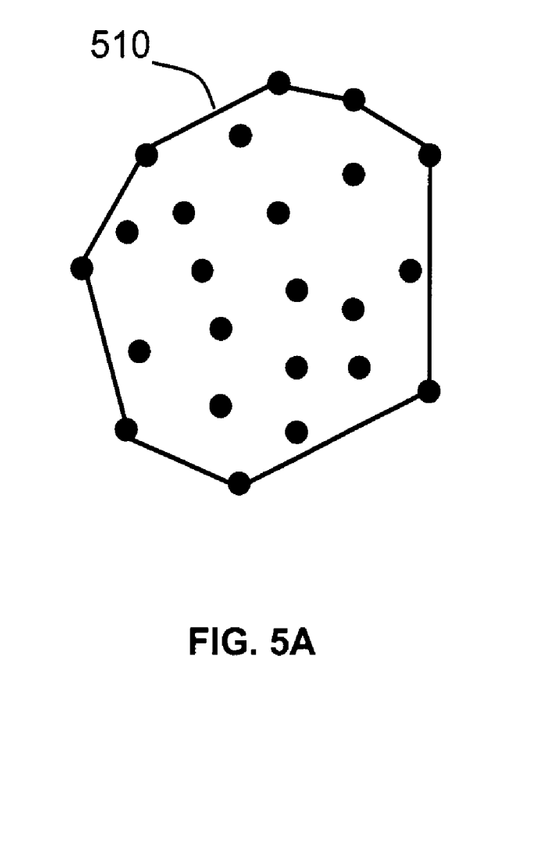
FIGS. 5A-5B are demonstrative illustrations of clusters of wafer data points according to embodiments of the present invention.
Figure 5B:
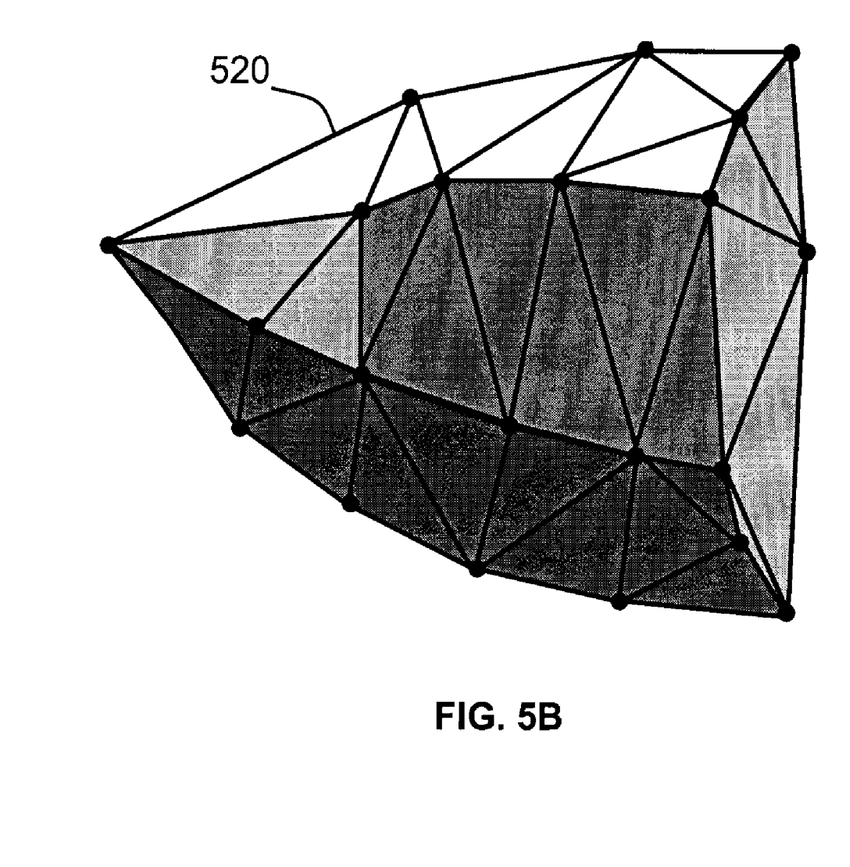

FIGS. 5A and 5B are demonstrative illustrations of sample clusters of calibration data points according to embodiments of the present invention. Specifically, FIG. 5A illustrates a data clustering scheme in a two-dimensional convex hull. The complexity of computing a single convex hull in a two-dimensional space is generally known as a function of N*log (N), or may be expressed as $f(N*\log(N))$. FIG. 5B illustrates a data clustering scheme in a three-dimensional convex hull. In generalizing, multiple (N) measurement or calibration data points may be clustered in a set of D-dimensional convex hull. The complexity of computing a single convex hull in a D-dimensional space may be a function of $N^{}(D/2)$, or may be expressed as $f(N^{}(D/2))$.

A person skilled in the art will appreciate that although convex hulls of clusters have been illustrated in FIGS. 5A and 5B above, the current invention is not limited in this respect. Other types of tight clusters, other than convex hulls, such as ellipsoids or spheres clusters in a D-dimensional space (D>=2) may be used as well to divide wafer calibration or measurement data points into clusters. In yet another embodiment, clusters may be modeled with any convex functions such as a Gaussian function.

There are many methods for performing clustering effectively that may be categorized into two types: i.e., a supervised clustering and an unsupervised clustering. In case of supervised clustering the number of clusters is known a-priori. In case of un-supervised clustering the number of clusters is not known a-priori. The algorithm decides the best number of clusters based on the distance metric or other specified properties.

Figure 6:
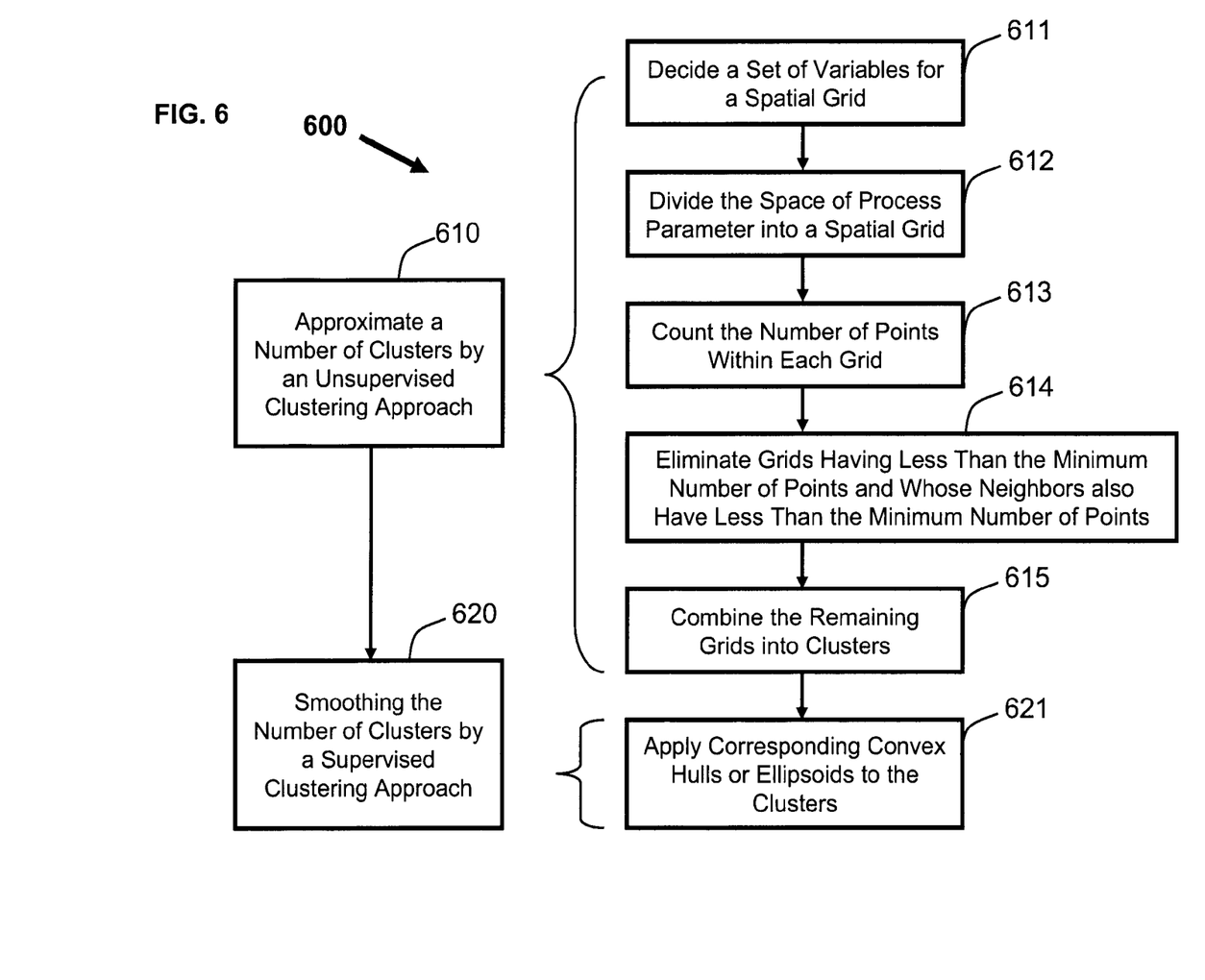
FIG. 6 is a demonstrative flowchart illustration of a method of performing clustering of wafer data points according to embodiments of the present invention.

FIG. 6 is a simplified flowchart illustration of performing clustering on calibration data according to some embodiments of the present invention. Method 600 first approximate a number of clusters by applying an unsupervised clustering approach, for example, a grid based clustering approach at step 610, and then smooth the number of clusters by applying a supervised clustering approach at step 620, both of which are described below in more details.

By applying an unsupervised clustering approach, method 600 may first decide a set of variables at step 611. The variables may include, among others, a dimensional variable from model calibration with a minimum and maximum value; the number of divisions for each dimension, e.g., a number around ten (10) to bin or separate process parameters obtained from model calibration; and minimum number of points in a grid, e.g., 0.2% of the total number of data points for a grid to be eliminated. Here the points may be image parameters or process parameters associated with the calibration data points. At step 612, method 600 may divide the space of process parameters, in all the given dimensions, into a spatial grid according to the decided division. Within each grid block, the number of process parameters or data points may be counted at step 613. If the number of points or process parameters inside a grid is less than the decided minimum number of points and whose neighbors also have points less than the minimum number, method 600 then eliminate the grid block at step 614.

After the elimination of all the grid blocks that have less than the minimum number of points, method 600 then combines the remaining grid blocks into clusters at step 615, where each cluster is separated from its neighbors by eliminated grid blocks.

According to one embodiment, clusters created at step 611 through step 615 by the grid based approach as described above may be further smoothed by a supervised clustering approach at step 620. For example, convex hulls and/or ellipsoids corresponding to the clusters may be used to create smoothed tight clusters at step 621.

According to embodiments of the present invention, the clusters of calibration data points may be applied in printability verification as described below in more detail. Referring back to FIG. 4, method 400 may apply the lithographic process model of OPC in printability verification according to one embodiment of the present invention. Specifically, method 400 may first select, at step 404, a point on the mask, and use the empirically calibrated process model to simulate the image at the point selected at step 405. Although the simulation may be performed, for example, in a manner similar to that shown in FIG. 2, the present invention is not limited in this respect and the simulation may be conducted in any other suitable manner. At step 406, method 400 may compute or derive a set of process parameters, or image parameters as may be referred to hereinafter, associated with the point under simulation by applying the process model. The process parameters may be expressed in a D-dimensional space, where D is typically less than N/10 with N being the total number of calibration data points. Thus, process parameters associated with the point under evaluation is a point in the D-dimensional space.

According to one embodiment of the present invention, the point in the D-dimensional space may be compared, at step 407, against the clusters computed or created at step 403 during model calibration. Upon comparison, method 400 may determine, at step 408, whether the point is away from the cluster or clusters in the D-dimensional space. If the point is determined, at step 409, as being sufficiently away from the clusters based on pre-determined criteria, predictability of the lithographic process model for that point may be flagged as small or potentially contain errors. On the other hand, if the point is determined, at step 410, as being relatively close to the cluster or clusters, the point under evaluation may be considered as safely within the predictability range of the underlying lithographic process model.

Figure 7:
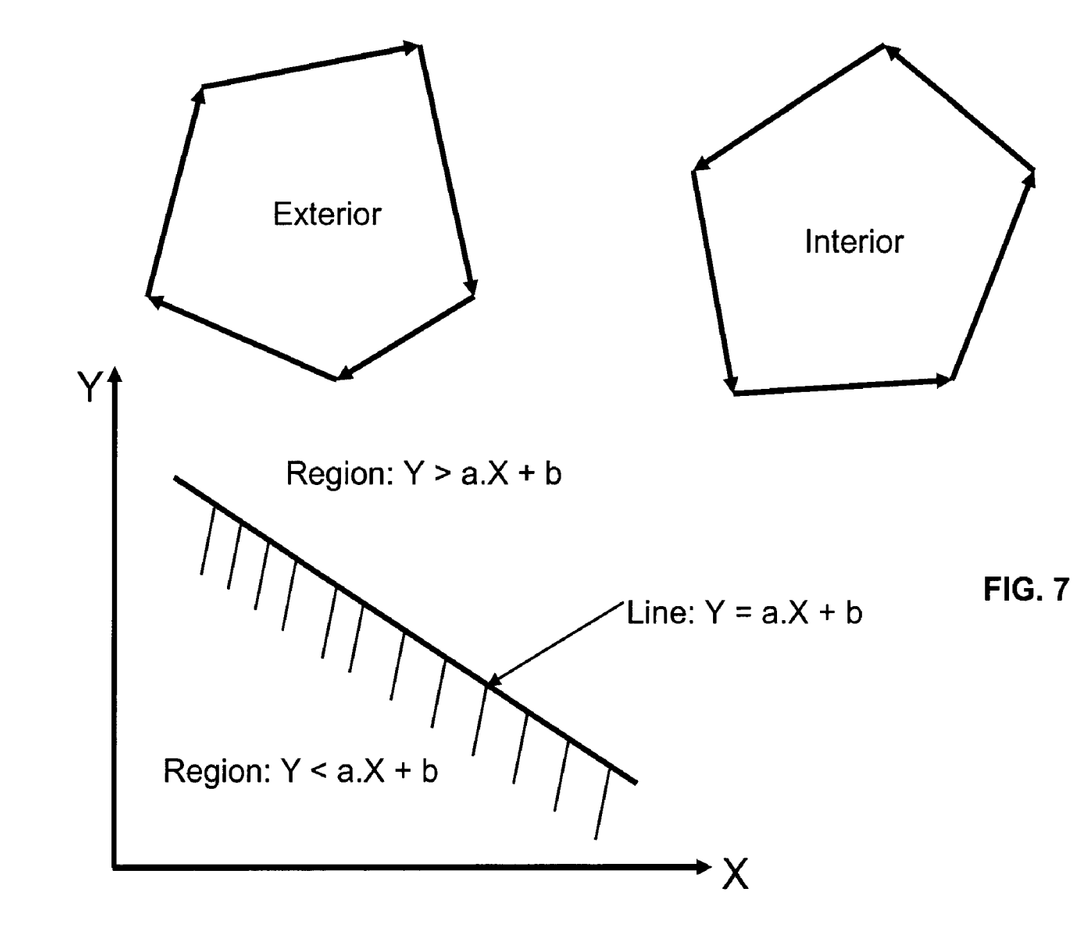
FIG. 7 is a demonstrative illustration of a method for determining if a point is in the interior or exterior of a cluster according to embodiments of the present invention.

Clusters divide the D-dimensional space into two regions, i.e., an interior region and an exterior region. FIG. 7 is a demonstrative illustration of a method for determining if a point is in the interior or exterior of a cluster according to embodiment of the invention. Here, for simplicity a two dimensional space is used and a convex hull cluster is chosen. According to one embodiment, the point in the D-dimensional space may be compared against a set of convex hulls. The cluster geometric structures may be expressed by a set of inequalities. In case of a convex hull, the set of inequalities may look like:

$SUM_k(a_{ij}.x_j) <= b_{jk}$, where i=1, ..., n (number of inequalities), j=1, ..., m (number of dimensions) and k=1, ..., o is the number of independent clusters. In case of ellipsoids there is only one inequality that can be expressed as:

$SUMk(a_j.x_{j2}) + SUM_k(c_{ij}x_ix_j) <= b_{jk}$, where i,j=1, ..., m (number of dimensions), and k=1, ..., o is the number of independent clusters and $c_{ij}$ denotes all the cross terms.

According to one embodiment, a given point that satisfies all the inequalities is considered to be inside the clusters and hence safe. According to another embodiment, a given point the estimate can be made less conservative by increasing the value of $b_{jk}$ to $b_{jk}(1+\alpha)$, where $\alpha$ is a variable whose default value is 0.1.

According to further embodiments, before testing whether a point is in the interior or exterior of a cluster, the clusters may be scaled up or down, preferably uniformly, by a small factor to create another convex cluster. The scaling factor may be manually defined, which may be a parameter based on the acceptable reliability of the lithographic process model.

Figure 8:
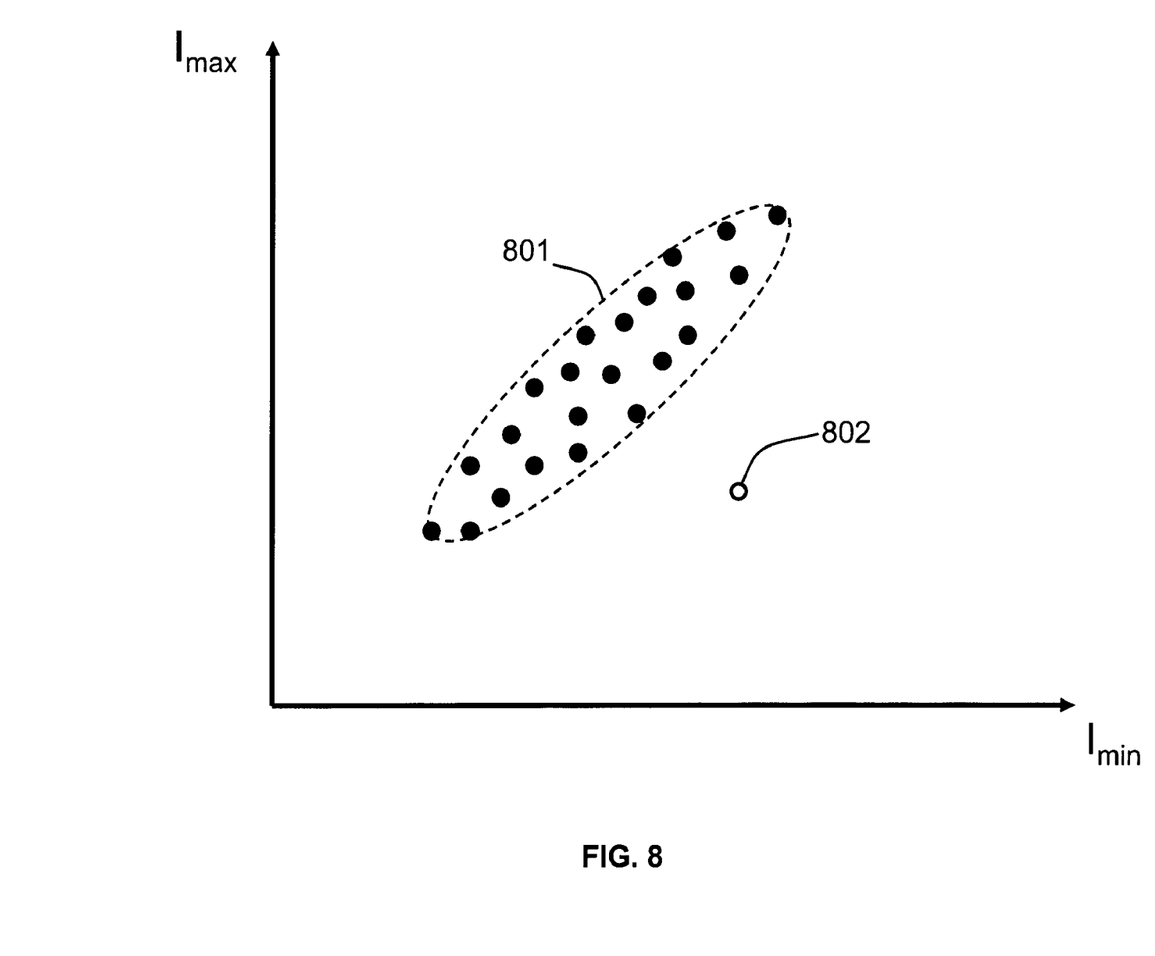
FIG. 8 is a demonstrative example of applying embodiments of the present invention to printability verification.

FIG. 8 is a demonstrative example of applying embodiments of the present invention to wafer calibration points shown in FIG. 3. FIG. 8 illustrates that by creating a tight cluster such as an ellipsoid cluster 801 enclosing calibration points shown in solid dots, test point 802 is clearly outside the cluster, and, therefore, according to the embodiment of the present invention would be classified as with suspicious predictability.

Figure 9A:
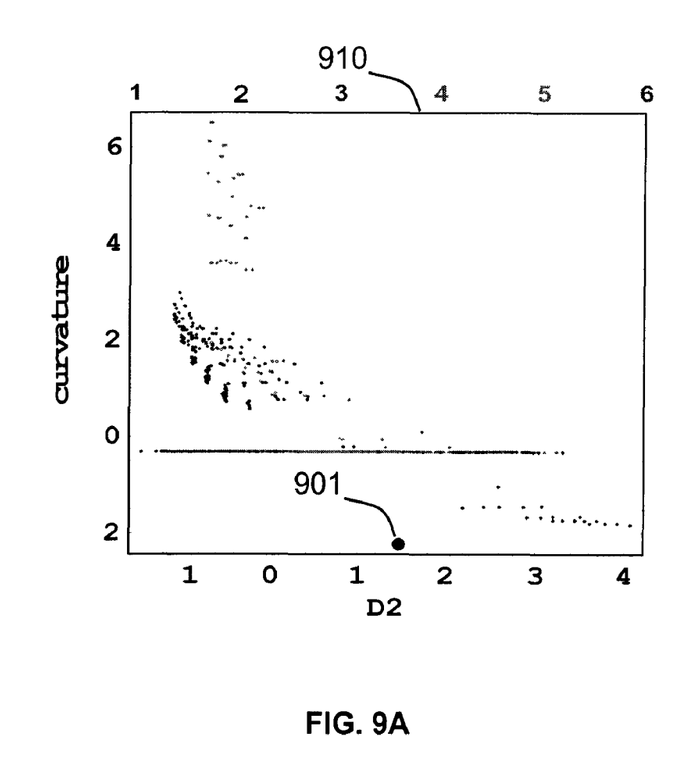
FIGS. 9A-9B are another demonstrative example of applying embodiments of the present invention to printability verification.
Figure 9B:
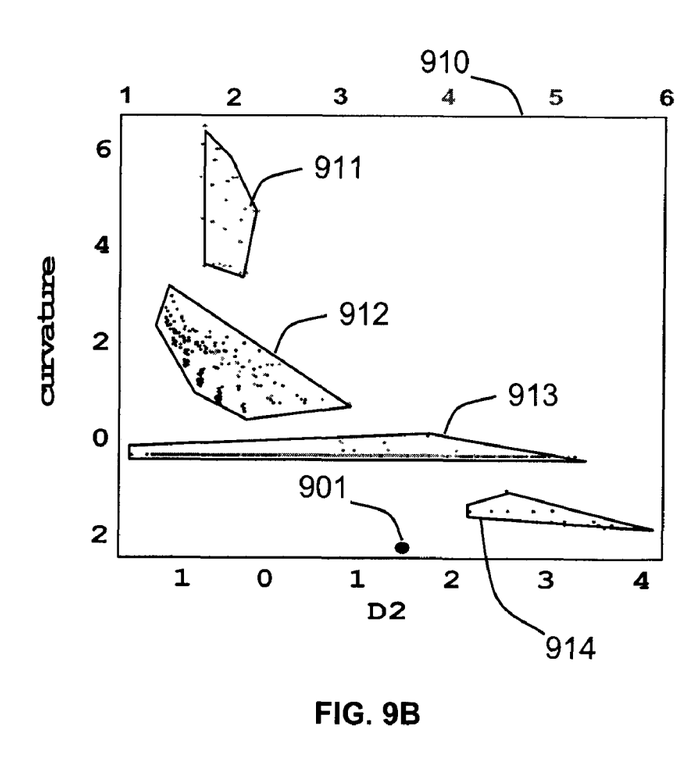

FIGS. 9A and 9B are another demonstrative example of applying embodiments of the present invention in printability verification. In FIG. 9A, a set of calibration data points are shown for image parameters, e.g., curvature and density parameter. Based on the conventional printability verification method, point 901 may be tested against square bounding box 910 which encloses these image parameters. FIG. 9A illustrates that point 901 lies within bounding box 910 and thus may be considered as unsuspicious. In this case, the printability verification thus fails to predict what happens actually in the wafer.

On the other hand, by applying the method of clustering as discussed above according to embodiments of the present invention, four tight clusters 911-914 may be created. Thus, point 901 becomes lying outside any of the created clusters and hence the predictability of this point may be considered as suspicious, as is clearly illustrated in FIG. 9B.

Figure 10:
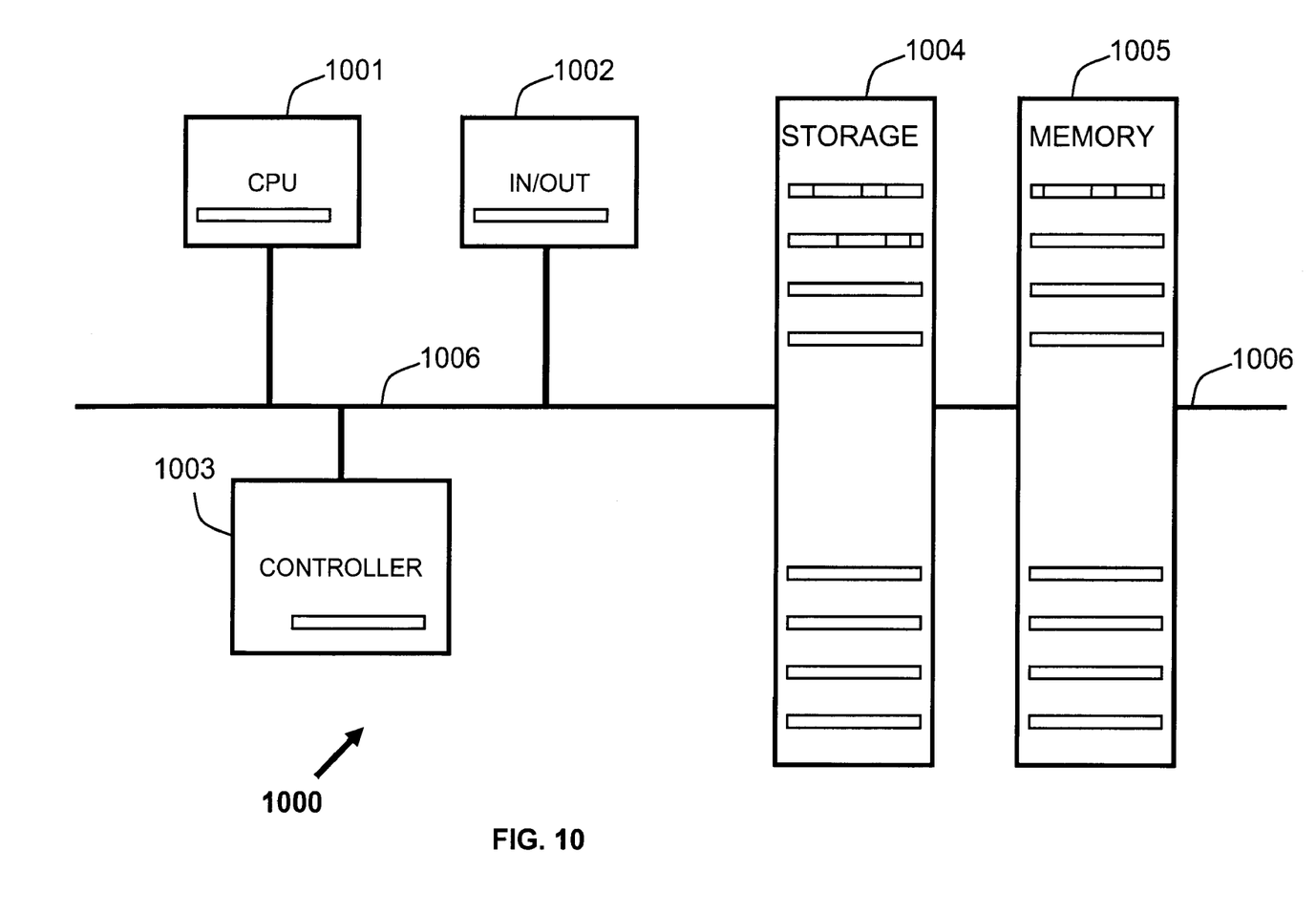
FIG. 10 is a demonstrative illustration of a computing system adapted to perform printability verification according to embodiment of the present invention.

Methods of obtaining effective bounds on process parameters as described above may be implemented in a machine, a computer, and/or a computing system or equipment. FIG. 10 is a simplified diagram illustration of a computing system 1000 according to one embodiment of the present invention. Computing system or computer system 1000 may include, inter alia, a central processing unit (CPU) 1001 for data processing, at least one input/output (I/O) device 1002 (such as a keyboard, a mouse, a compact disk (CD) drive, a display device, or a combination thereof or the like) for accepting instructions and/or input from an operator or user and outputting results from CPU processing data during simulation or computation, a controller 1003 capable of controlling the operation of computing system 1000, a storage device or medium 1004 capable of reading and/or writing computer readable code, and a memory device or medium 1005—all of which are operationally connected, e.g., by a bus or a wired or wireless communications network (1006). Embodiments of the present invention may be implemented as a computer program product stored on a computer readable medium such as storage device 1004, or memory device 1005, a tape or a compact disk (CD). The computer program product may contain instructions which may implement the method according to embodiments of the present invention on the computer system 1000. Finally, the present invention can also be implemented in a plurality of distributed computers where the present items may reside in close physical proximity or distributed over a large geographic region and connected by a communications network.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the spirit of the invention.

What is claimed is:

1. A method for performing printability verification of a mask layout, the method comprising:
creating one or more tight clusters;
computing a set of process parameters associated with a point on said mask;
comparing said set of process parameters to said one or more tight clusters; and
reporting an error when at least one of said process parameters is away from said one or more tight clusters,
wherein said one or more tight clusters is a cluster selected from a group consisting of convex hull and ellipsoid.

2. The method of claim 1, wherein said creating one or more tight clusters comprises:
measuring a group of calibration data from a plurality of test structures;
creating a process model in a space having one or more dimensions;

applying said process model to said group of calibration data thus obtaining a group of process parameters; and dividing said group of process parameters into said one or more tight clusters in said space of one or more dimensions.

3. The method of claim 2, wherein said dividing said group of process parameters comprises:

applying a grid based unsupervised clustering approach thus approximating a number of clusters from said group of process parameters; and applying a supervised clustering approach thus smoothing said number of clusters.

4. The method of claim 3, wherein smoothing said number of clusters comprises applying convex hulls or ellipsoids to corresponding process parameters in said number of clusters.

5. The method of claim 2, wherein said computing a set of process parameters comprises:

identifying said point on said mask;

applying said process model to said point thus obtaining an output point corresponding to said point on said mask; and deriving said set of process parameters from said output point.

6. The method of claim 1, wherein said comparing said set of process parameters comprises providing one or more pre-determined values relating to a level of predictability establishing one or more inequalities for said one or more tight clusters using said one or more pre-determined values;

applying said one or more inequalities in testing said set of process parameters; and determining whether one or more of said process parameters are away from said one or more tight clusters from said testing.

7. The method of claim 2, wherein data in said group of calibration data are about 7 to about 20 times more than the dimensions of said space.

8. The method of claim 1, wherein said reporting an error comprises reporting said error when said at least one of said process parameters is away from said one or more tight clusters by a pre-determined value.

9. A system for performing printability verification of a mask layout, the system comprising:

at least one storage device to store machine-readable codes;

a central processing unit (CPU) operationally connected to the storage device; and a controller controlling the storage device and the CPU, wherein the CPU is adapted to execute the machine-readable codes to:

creating one or more tight clusters;

computing a set of process parameters associated with a point on said mask;

comparing said set of process parameters to said one or more tight clusters; and reporting an error when at least one of said process parameters is away from said one or more tight clusters, wherein said one or more tight clusters is a cluster selected from a group consisting of convex hull and ellipsoid.

10. The system of claim 9, further comprising at least one input/output device, said input/output device is adapted to accepting instructions and input from an operator and for outputting results from CPU executing the machine-readable codes during simulation.

11. The system of claim 9, wherein to create said one or more tight clusters, the CPU is adapted to:

measuring a group of calibration data from a plurality of test structures;

creating a process model in a space having one or more dimensions;

applying said process model to said group of calibration data thus obtaining a group of process parameters; and dividing said group of process parameters into said one or more tight clusters in said space of one or more dimensions.

12. The system of claim 11, wherein to divide said group of process parameters, the CPU is adapted to:

applying a grid based unsupervised clustering approach thus approximating a number of clusters from said group of process parameters; and applying a supervised clustering approach thus smoothing said number of clusters.

13. The system of claim 12, wherein to smooth the number of clusters, the CPU is adapted to applying convex hulls or ellipsoids to corresponding process parameters in the number of clusters.

14. A machine-readable storage medium having stored thereupon a set of instruction that, when executed by a machine, result in:

creating one or more tight clusters;

computing a set of process parameters associated with a point on said mask;

comparing said set of process parameters to said one or more tight clusters; and reporting an error when at least one of said process parameters is away from said one or more tight clusters, wherein said one or more tight clusters is a cluster selected from a group consisting of convex hull and ellipsoid.

15. The machine-readable storage medium of claim 14, wherein said creating one or more tight clusters comprises:

measuring a group of calibration data from a plurality of test structures;

creating a process model in a space having one or more dimensions;

applying said process model to said group of calibration data thus obtaining a group of process parameters; and dividing said group of process parameters into said one or more tight clusters in said space of one or more dimensions.

16. The machine-readable storage medium of claim 15, wherein said dividing said group of process parameters comprises:

applying a grid based unsupervised clustering approach thus approximating a number of clusters from said group of process parameters; and applying a supervised clustering approach thus smoothing said number of clusters.

17. The machine-readable storage medium of claim 16, wherein smoothing said number of clusters comprises applying convex hulls or ellipsoids to corresponding process parameters in said number of clusters.

18. The machine-readable storage medium of claim 15, wherein said computing a set of process parameters comprises:

identifying said point on said mask;

applying said process model to said point thus obtaining an output point corresponding to said point on said mask; and deriving said set of process parameters from said output point.

19. The machine-readable storage medium of claim 14, wherein said comparing said set of process parameters comprises provide one or more pre-determined values relating to a level of predictability establishing one or more inequalities for said one or more tight clusters using said one or more pre-determined values;

applying said one or more inequalities in testing said set of process parameters; and determining whether one or more of said process parameters are away from said one or more tight clusters from said testing.

20. The machine-readable storage medium of claim 15, wherein data in said group of calibration data are about 7 to about 20 times more than the dimensions of said space.

21. The machine-readable storage medium of claim 14, wherein said reporting an error comprises reporting said error when said at least one of said process parameters is away from said one or more tight clusters by a pre-determined value.

* * * * *